(12) United States Patent  
Im et al.

(10) Patent No.: US 12,265,488 B2
(45) Date of Patent: Apr. 1, 2025

(54) APPARATUS AND METHOD FOR DIE-TO-DIE (D2D) INTERCONNECTS

(71) Applicant: Samsung Electronics Co., Ltd., Suwon-si (KR)

(72) Inventors: Wangyong Im, Suwon-si (KR); Byoungkon Jo, Suwon-si (KR); Gyesik Oh, Suwon-si (KR); Duksung Kim, Suwon-si (KR); Jangseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/385,590

(22) Filed: Oct. 31, 2023

(65) Prior Publication Data
US 2024/0241840 A1 Jul. 18, 2024

(30) Foreign Application Priority Data

Jan. 17, 2023 (KR) .................. 10-2023-0006990

(51) Int. Cl.
G06F 13/38 (2006.01)
G06F 13/16 (2006.01)
G06F 13/40 (2006.01)

(52) U.S. Cl.
CPC ...... *G06F 13/1668* (2013.01); *G06F 13/4068* (2013.01)

(58) Field of Classification Search
CPC .................. G06F 13/1668; G06F 13/4068
See application file for complete search history.

(56) References Cited

U.S. PATENT DOCUMENTS

| 6,873,182 | B2 | 3/2005 | Mohan et al. |
| 7,707,467 | B2 | 4/2010 | Louie et al. |
| 10,120,591 | B2 * | 11/2018 | Jeon ......................... G11C 8/18 |
| 10,474,585 | B2 * | 11/2019 | Lee ..................... G06F 12/1009 |

(Continued)

FOREIGN PATENT DOCUMENTS

| KR | 100370140 B1 | 1/2003 |
| KR | 101048606 B1 | 7/2011 |
| WO | 2011160957 A1 | 12/2011 |

OTHER PUBLICATIONS

EESR dated Jun. 11, 2024 for corresponding EP Patent Application No. 24151959.4.

(Continued)

*Primary Examiner* — Cheng Yuan Tseng
(74) *Attorney, Agent, or Firm* — Muir Patent Law, PLLC

(57) ABSTRACT

An apparatus includes a first die connected to a second die through a die-to-die (D2D) interface. The first die includes a first interconnect configured to provide first lanes communicating with the second die to the D2D interface, the first interconnect includes a first logic circuit configured to indicate a correlation between a number of chiplet dies connected to the first lanes and connected signal pins from among a plurality of signal pins of the connected chiplet dies. The second die includes the number of connected chiplet dies each including a second interconnect configured to provide second lanes to the D2D interface from each of the connected chiplet dies. The second lanes are configured to be set according to a number of the connected signal pins of the connected chiplet dies.

20 Claims, 13 Drawing Sheets

(56) References Cited

U.S. PATENT DOCUMENTS

| | | | | |
|---|---|---|---|---|
| 11,620,077 B2* | 4/2023 | Borgonovo | ......... | G06F 12/0607 |
| | | | | 711/154 |
| 11,726,701 B2* | 8/2023 | Lee | ...................... | G06F 3/0655 |
| | | | | 711/154 |
| 11,741,034 B2* | 8/2023 | Nam | ..................... | G06F 3/0647 |
| | | | | 710/22 |
| 11,756,646 B2* | 9/2023 | Kim | ....................... | G11C 29/42 |
| | | | | 365/201 |
| 2018/0196767 A1 | 7/2018 | Linstadt | | |
| 2020/0364142 A1 | 11/2020 | Lin et al. | | |
| 2022/0138142 A1 | 5/2022 | Walker et al. | | |
| 2022/0262415 A1 | 8/2022 | Menon et al. | | |
| 2022/0327276 A1 | 10/2022 | Seshan et al. | | |
| 2022/0334995 A1* | 10/2022 | Das Sharma | ....... | G06F 13/4221 |
| 2022/0391114 A1 | 12/2022 | Richter et al. | | |

OTHER PUBLICATIONS

Sharma Debendra Das, "System on a package Innovations Universal Chiplet Interconnect Express (UCIe) Interconnect", IEEE Micro, IEEE Service Center, Los Alamitos, CA, US, vol. 43, No. 2, Jan. 9, 2023 (Jan. 9, 2023), pp. 76-85, XP011935795, ISSN: 0272-1732, DOI: 10.1109/MM.2023.3235770 [retrieved on Jan. 10, 2023].

Compute Express Link (CXL) Specification, Aug. 1, 2022/ Revision 3.0, Version 1.0.

PCI Express® Base Specification Revision 5.0 Version 1.0, May 22, 2019.

Universal Chiplet Interconnect Express (UCIe) Specification Revision 1.0, Feb. 24, 2022.

* cited by examiner

600

UCIe 64 Lane

| # of CHIPLET DRAM | | CA pin | | | | |
|---|---|---|---|---|---|---|
| | | x1 | x2 | x4 | x8 | x16 |
| DQ Pin | x2 | 20ea | 15ea | 10ea | 6ea | 3ea |
| | x4 | 12ea | 10ea | 7ea | 5ea | 3ea |
| | x8 | 6ea | 6ea | 5ea | 3ea | 2ea |
| | x16 | 3ea | 3ea | 3ea | 2ea | 1ea |
| | x32 | 1ea | 1ea | 1ea | 1ea | 1ea |

FIG. 8

| Command | CA0 | CA1 | CK_t edge |
|---|---|---|---|
| ACT | BG0 | BG1 | ⎍ R1 |
| | BA0 | BA1 | ⎑ F1 |
| | RA0 | RA1 | ⎍ R2 |
| | RA2 | RA3 | ⎑ F2 |
| | RA4 | RA5 | ⎍ R3 |
| | RA6 | RA7 | ⎑ F3 |
| | RA8 | RA9 | ⎍ R4 |
| | RA10 | RA11 | ⎑ F4 |
| | RA12 | RA13 | ⎍ R5 |
| | RA14 | RA15 | ⎑ F5 |
| PRE | BG0 | BG1 | ⎍ R1 |
| | BA0 | BA1 | ⎑ F1 |

T800

| Command | CA0 | CA1 | CA2 | CA3 | CA4 | CA5 | CA6 | CA7 | CK_t edge |
|---|---|---|---|---|---|---|---|---|---|
| ACT | V | V | V | V | BG0 | BG1 | BA0 | BA1 | ⌐R1 |
| | RA0 | RA1 | RA2 | RA3 | RA4 | RA5 | RA6 | RA7 | ⌐F1 |
| | RA8 | RA9 | RA10 | RA11 | RA12 | RA13 | RA14 | RA15 | ⌐R2 |
| PRE | V | V | V | V | BG0 | BG1 | BA0 | BA1 | ⌐R1 |

APPARATUS AND METHOD FOR DIE-TO-DIE (D2D) INTERCONNECTS

CROSS-REFERENCE TO RELATED APPLICATION(S)

This application is based on and claims priority under 35 U.S.C. § 119 to Korean Patent Application No. 10-2023-0006990, filed on Jan. 17, 2023, in the Korean Intellectual Property Office, the disclosure of which is incorporated by reference herein in its entirety.

BACKGROUND

The inventive concept relates to semiconductor memories and methods, and more particularly to an apparatus and method for die-to-die (D2D) interconnects.

An electronic device configured to process data may perform various operations by accessing a memory. For example, the electronic device may process data read from the memory or write processed data into the memory. Due to the performance and functions demanded to a system, various electronic devices that communicate with one another through a link providing high bandwidth and low latency may be included in the system.

A system-in-package (SIP) may use a chiplet-based architecture that combines a plurality of dedicated small dies into a single package. The performance of a system may depend on the communication efficiency and access times between the chiplets, as well as the operating speed of each chiplet. Therefore, it is important to configure die-to-die (D2D) interconnects in a chiplet architecture.

SUMMARY

The inventive concept provides an apparatus and method for die-to-die interconnects suitable for system applications.

According to an aspect of the inventive concept, there is provided an apparatus including a first die connected to a second die through a die-to-die (D2D) interface. The first die includes a first interconnect configured to provide first lanes communicating with the second die to the D2D interface, and the first interconnect includes a first logic circuit configured to indicate a correlation between a number of chiplet dies connected to the first lanes and connected signal pins from among a plurality of signal pins of the connected chiplet dies. The second die includes the number of connected chiplet dies each including a second interconnect configured to provide second lanes to the D2D interface from each of the connected chiplet dies. The second interconnect includes a second logic circuit configured to indicate the correlation, and the second lanes are configured to be set according to a number of the connected signal pins of the connected chiplet dies.

According to another aspect of the inventive concept, there is provided a method of communicating using a die-to-die (D2D) interface, the method including providing first lanes of a first die connected to a second die to the D2D interface through a first interconnect of the first die, providing second lanes of the second die to the D2D interface through a second interconnect of the second die, setting a correlation between a number of chiplet dies of the second die connected to the first lanes and connected signal pins from among a plurality of signal pins of the connected chiplet dies in a logic circuit of each of the first and second interconnects, setting the second lanes according to a number of the connected signal pins of the connected chiplet dies, and communicating between the first die and the connected chiplet dies in an interconnected state, via the D2D interface.

According to another aspect of the inventive concept, there is provided an apparatus including a first die including a host processor, and a second die connected to the first die through a die-to-die (D2D) interface, and including a die architecture separated from the first die. The first die includes a first interconnect configured to provide first lanes to the D2D interface, and the first interconnect includes a first logic circuit configured to indicate a correlation between a number of chiplet dynamic random access memories (DRAMs) connected to the first lanes and command/address (CA) pins and data (DQ) pins from among a plurality of signal pins of the connected chiplet DRAMs. Each of the number of chiplet DRAMs includes a second interconnect configured to provide second lanes to the D2D interface, the second interconnect includes a second logic circuit configured to indicate the correlation, and the first die and the number of chiplet DRAMs are configured to communicate with each other in an interconnected state through the D2D interface.

BRIEF DESCRIPTION OF THE DRAWINGS

Example embodiments of the inventive concept will be more clearly understood from the following detailed description taken in conjunction with the accompanying drawings in which:

FIGS. 7 to 10 are diagrams for describing a UCI interconnect according to example embodiments;

DETAILED DESCRIPTION OF THE EMBODIMENTS

Figure 1:
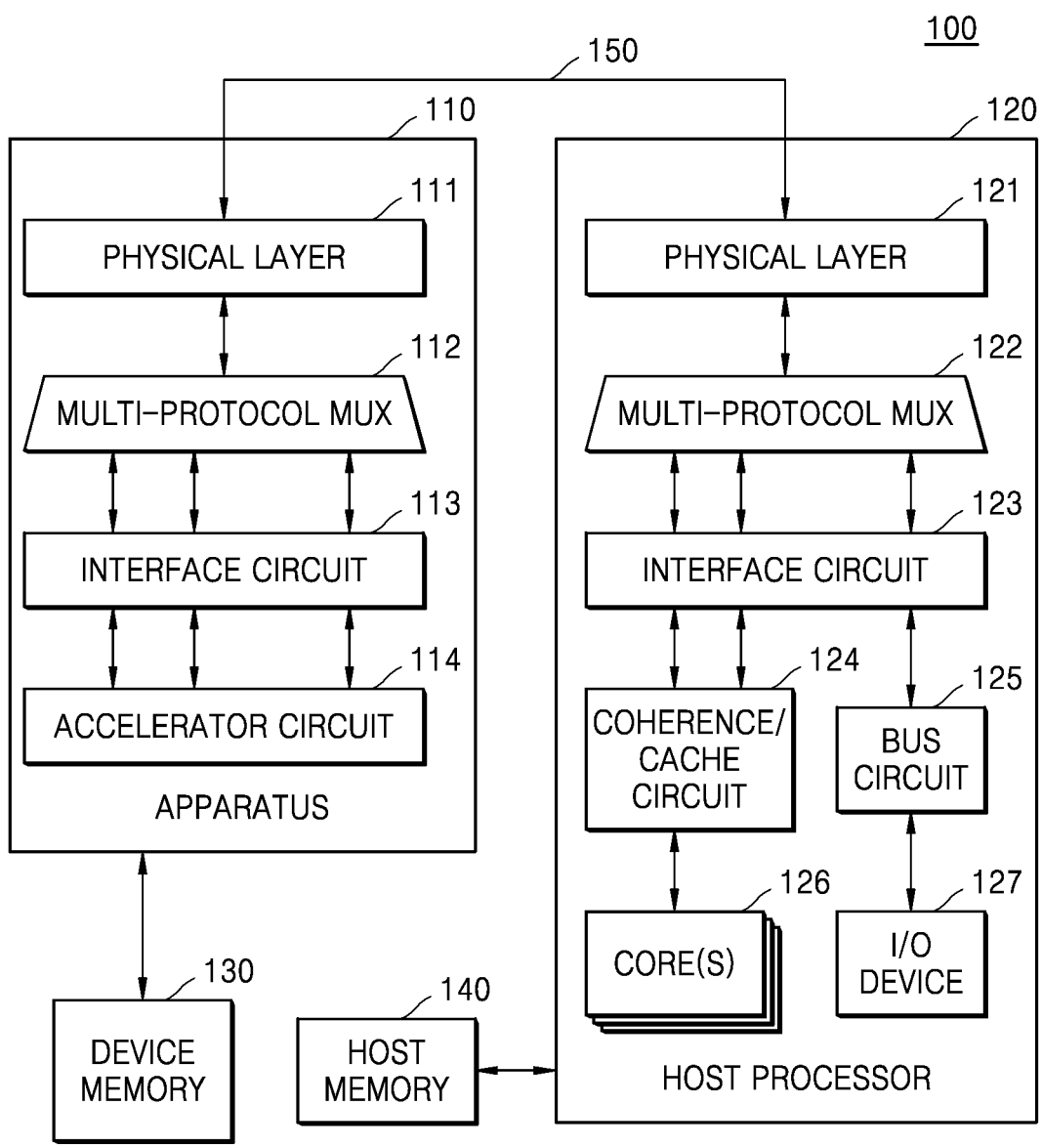
FIG. 1 is a block diagram showing a system according to example embodiments.

FIG. 1 is a block diagram showing a system according to example embodiments. A system 100 of FIG. 1 may be any computing system (or a component included in a computing system) that includes an apparatus (or, a device) 110 and a host processor 120 that communicate with each other. For example, the system 100 may be included in a stationary computing system like a desktop computer, a server, and a kiosk or may be included in a portable computing system like a laptop computer, a mobile phone, and a wearable device. Furthermore, according to some embodiments, the system 100 may be included in a system-on-chip (SoC) or a system-in-package (SiP) system, in which the apparatus 110 and the host processor 120 are implemented on a single chip or a single package. The system 100 may include the apparatus 110, the host processor 120, a device memory 130, and a host memory 140.

Referring to FIG. 1, the apparatus 110 and the host processor 120 may communicate with each other through a link 150 and may transmit or receive messages and/or data to and from each other through the link 150. Embodiments of the inventive concept will be described with reference to the link 150 based on a compute express link (CXL) specification that supports CXL protocols. However, as non-limiting examples, the apparatus 110 and the host processor 120 may communicate with each other based on coherent interconnect protocols like an XBus protocol, an NVLink protocol, an Infinity Fabric protocol, a cache coherent interconnect for accelerators (CCIX) protocol, and a coherent accelerator processor interface (CAPI) protocol.

According to some embodiments, the link 150 may support multiple protocols, and messages and/or data may be transferred through the multiple protocols. For example, the link 150 may support CXL protocols including a non-coherent protocol (e.g., CXL.io), a coherent protocol (e.g., CXL.cache) and a memory access protocol (or a memory protocol) (e.g., CXL.mem). A memory protocol may define transactions between a master and a subordinate. For example, a memory protocol may define transactions from a master to a subordinate and transactions from the subordinate to the master. A coherent protocol may define interactions between the apparatus 110 and the host processor 120. For example, an interface of a coherent protocol may include three channels including request, response and data. A non-coherent protocol may provide a non-coherent load/store interface for input/output devices. According to some embodiments, the link 150 may support a protocol like, but not limited to, a peripheral component interconnect (PCI), a PCI express (PCIe), a universal serial bus (USB), and a serial advanced technology attachment (SATA).

The apparatus 110 may refer to any device that provides useful functionality to the host processor 120, and, according to some embodiments, may correspond to a CXL specification-based accelerator. For example, software executed on the host processor 120 may offload at least a part of a computing and/or input/output (I/O) task to the apparatus 110. According to some embodiments, the apparatus 110 may include at least one of a programmable component like a graphics processing unit (GPU) and a neural processing unit (NPU), a component providing a fixed function like an intellectual property (IP) core, and a reconfigurable component like a field programmable gate array (FPGA). The apparatus 110 may include a physical layer 111, a multi-protocol multiplexer 112, an interface circuit 113, and an accelerator circuit 114 and may communicate with the device memory 130.

The accelerator circuit 114 may perform useful functions that apparatus 110 provides to host processor 120 and may also be referred to as an accelerator logic. When the device memory 130 is included in the system 100 as shown in FIG. 1, the accelerator circuit 114 may communicate with the device memory 130, wherein the accelerator circuit 114 may communicate with the device memory 130 based on a protocol independent of the link 150, for example, a device-specific protocol. The accelerator circuit 114 may communicate with the host processor 120 via the interface circuit 113 by using a plurality of protocols.

The interface circuit 113 may determine one of the plurality of protocols based on messages and/or data for communication between the accelerator circuit 114 and the host processor 120. The interface circuit 113 may be connected to at least one protocol queue included in the multi-protocol multiplexer 112 and may exchange messages and/or data with the host processor 120 through the at least one protocol queue. According to some embodiments, the interface circuit 113 and the multi-protocol multiplexer 112 may be integrated into one component. According to some embodiments, the multi-protocol multiplexer 112 may include a plurality of protocol queues respectively corresponding to a plurality of protocols supported by the link 150. Also, according to some embodiments, the multi-protocol multiplexer 112 may arbitrate between communications according to different protocols and provide selected communications to the physical layer 111. According to some embodiments, the physical layer 111 may be connected to the physical layer 121 of the host processor 120 through a single interconnect, a single bus, a single trace, etc.

The host processor 120 may be a main processor of the system 100, e.g., a central processing unit (CPU), and may correspond to a CXL specification-based host processor (or host) in some embodiments. The host processor 120 may be connected to the host memory 140 and may include a physical layer 121, a multi-protocol multiplexer 122, an interface circuit 123, a coherency/cache circuit 124, a bus circuit 125, at least one core 126, and an input/output device 127.

The at least one core 126 may execute instructions and may be connected to the coherency/cache circuit 124. The coherency/cache circuit 124 may include a cache hierarchy and may also be referred to as a coherency/cache logic. The coherency/cache circuit 124 may communicate with the at least one core 126 and the interface circuit 123. For example, the coherency/cache circuit 124 may enable communication through two or more protocols including a coherency protocol and a memory access protocol. According to some embodiments, the coherency/cache circuit 124 may include a direct memory access (DMA) circuit. The input/output device 127 may be used to communicate with the bus circuit 125. For example, the bus circuit 125 may be a PCIe logic, and the input/output device 127 may be a PCIe input/output device.

The interface circuit 123 may enable communication between components of host processor 120 (e.g., between the coherency/cache circuit 124 and the bus circuit 125) and the apparatus 110. According to some embodiments, the interface circuit 123 may enable communication of messages and/or data between components of the host processor 120 and the apparatus 110 according to a plurality of protocols, e.g., a non-coherent protocol, a coherent protocol, and a memory protocol. For example, the interface circuit 123 may determine one of a plurality of protocols based on messages and/or data for communication between the components of host processor 120 and the apparatus 110.

The multi-protocol multiplexer 122 may include at least one protocol queue. The interface circuit 123 may be connected to the at least one protocol queue and may exchange messages and/or data with the apparatus 110 through the at least one protocol queue. According to some embodiments, the interface circuit 123 and the multi-protocol multiplexer 122 may be integrated into one component. According to some embodiments, the multi-protocol multiplexer 122 may include a plurality of protocol queues respectively corresponding to a plurality of protocols supported by the link 150. Also, according to some embodiments, the multi-protocol multiplexer 122 may arbitrate between communications according to different protocols and provide selected communications to the physical layer 121.

According to some embodiments, the host processor 120 may execute hierarchical software including an operating system (OS) and/or applications executable on the OS and may access the host memory 140 and/or the device memory 130 based on a virtual memory. The host processor 120 and the host memory 140 may be connected to each other through a die-to-die (D2D) interface, and the apparatus 110 and the device memory 130 may also be connected to each other through a D2D interface.

As described later with reference to the drawings, the D2D interface may support a CXL protocol or a Universal Chiplet Interconnect express (UCIe) protocol for communication between a first die and a second die. The first die may include a first interconnect that provides first lanes communicating with the second die to the D2D interface. The second die may include a plurality of connected chiplet dies communicating with the first die, and each of the plurality of connected chiplet dies may include a second interconnect that provides second lanes to the D2D interface. Each of the first interconnect and the second interconnect may include a logic circuit configured to indicate or store a correlation between the number of connected chiplet dies connected to the first lanes and connected signal pins from among a plurality of signal pins of each of the connected chiplet dies. According to an embodiment, a large number of chiplet memories implemented with a relatively small number of connected signal pins (e.g., command/address (CA) pins and data (DQ) pins) based on a mapping table of the logic circuit may provide a high-capacity memory solution for the D2D interface. According to another embodiment, a small number of chiplet memories implemented with a relatively large number of connected CA pins and connected DQ pins based on a mapping table of the logic circuit may provide a high-speed and high-performance solution for the D2D interface.

Figure 2:
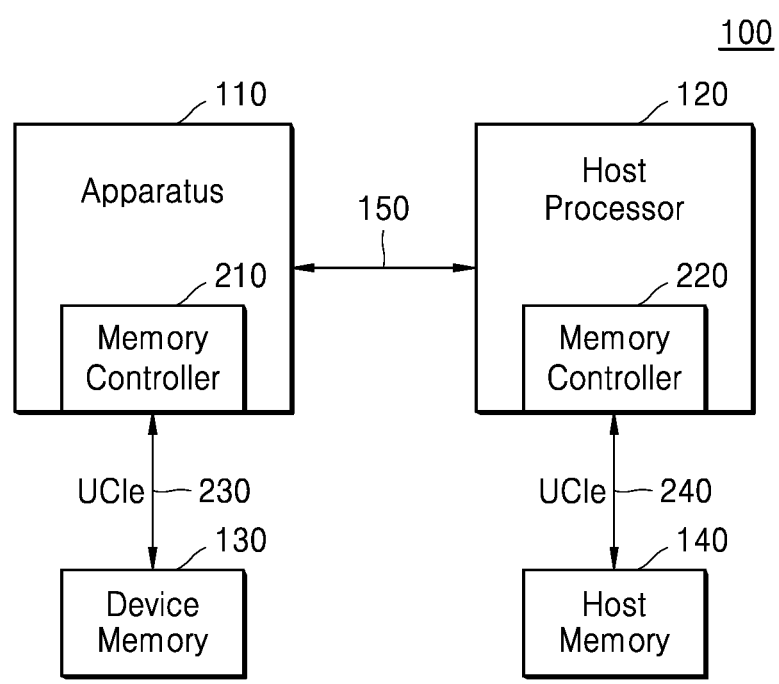
FIGS. 2 to 4 are diagrams for describing a system having a chiplet architecture according to example embodiments.
Figure 3:
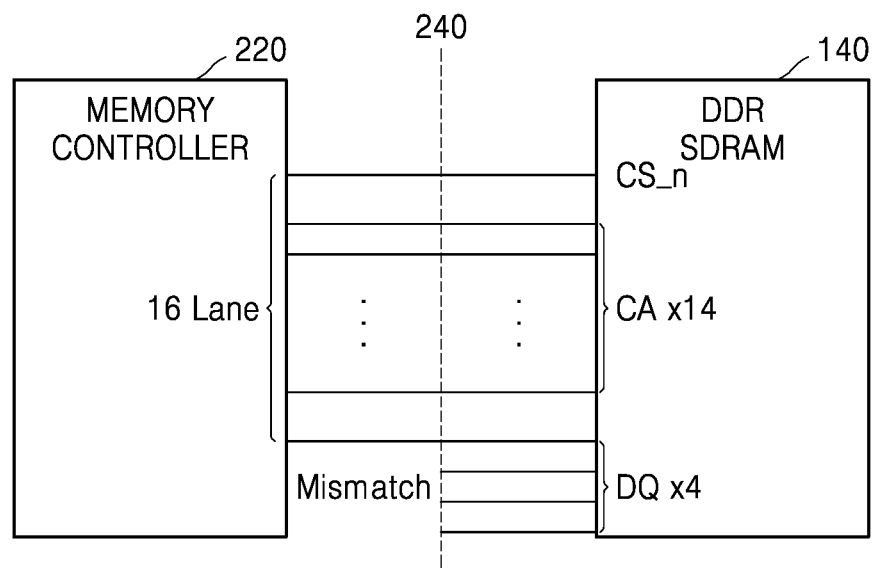
Figure 4:
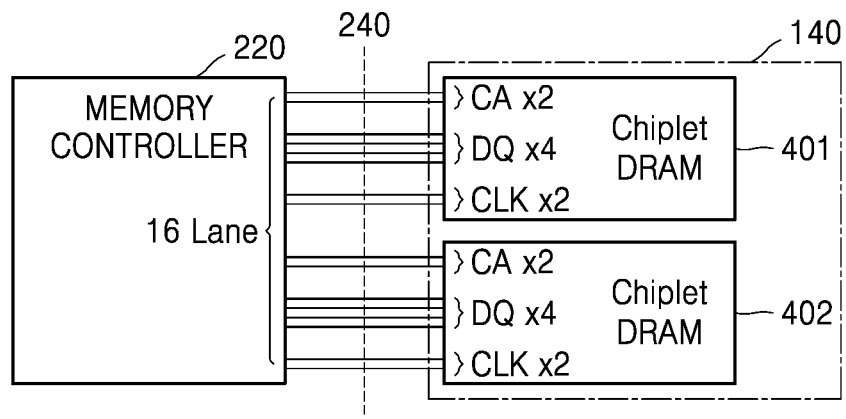

FIGS. 2 to 4 are diagrams for describing a system having a chiplet architecture according to example embodiments. FIG. 2 is a block diagram for describing an example in which the apparatus 110 and the host processor 120 of FIG. 1 are respectively connected to the device memory 130 and the host memory 140 by using a UCIe protocol supporting disaggregated die architectures. FIGS. 3 and 4 are diagrams for describing UCI interfaces 230 and 240 of FIG. 2, and, for convenience of explanation, a UCI interface 240 between the host processor 120 and the host memory 140 will be described in detail. The description of the UCI interface 240 may be equally applied to a UCI interface 230 between the apparatus 110 and the device memory 130.

Referring to FIG. 2, the apparatus 110 may communicate with the device memory 130 through the UCI interface 230 and may include a memory controller 210 to access the device memory 130. According to some embodiments, unlike as shown in FIG. 2, the memory controller 210 may be disposed outside the apparatus 110. Also, the host processor 120 may communicate with the host memory 140 through the UCI interface 240 and may include a memory controller 220 to access the host memory 140. According to some embodiments, unlike as shown in FIG. 2, the memory controller 220 may be disposed outside the host processor 120.

The UCI interfaces 230 and 240 may support various protocols to enable various applications. The UCI interfaces 230 and 240 may support multiple protocols like a CXL protocol, a PCIe protocol, and a user-defined protocol through a UCIe link. A UCIe link may include one or more lanes that are UCIe-connected between chiplets. A lane may include lines that interconnect pins of chiplets and carry signals. In this specification, the term "lane" may refer to any and all interconnect circuits coupling one die to another die.

Referring to FIG. 3, the UCI interface 240 interconnecting the memory controller 220 of the host processor 120 and the host memory 140 is indicated by a dashed line. The UCI interface 240 in the case where the host memory 140 connected to the memory controller 220 is implemented as a Double Data Rate Synchronous Dynamic Random Access Memory (DDR SDRAM) is shown. The DDR SDRAM may include, for example, a chip select signal (CS_n) pin, 14 command/address (CA) pins, and 4 data (DQ) pins. When the UCI interface 240 includes, for example, 16 lanes, it is difficult to apply a DDR SDRAM to the UCI interface 240 due to pin mismatch in terms of point-to-point interconnect. To resolve this problem, as shown in FIG. 4, chiplet DRAMs 401 and 402 connected to the UCI interface 240 may be configured as the host memory 140. For brevity of the drawing, the descriptions below will be given under the assumption that a CA xN includes N (N is a non-zero integer) CA pins, a DQ xM includes M (M is a non-zero integer) DQ pins, and an xP UCI interface includes P (P is a non-zero integer) lanes, and this will be equally applied to embodiments below.

Referring to FIG. 4, the host memory 140 may include two chiplet DRAMs 401 and 402. The chiplet DRAMs 401 and 402 may include the same dies and each include 8 pins including 2 CA pins, 4 DQ pins, and 2 clock signal (CLK) pins. Herein, for convenience of explanation, each of the chiplet DRAMs 401 and 402 may include CA pins, DQ pins, and clock signal (CLK) pins. A clock signal CLK may include various clock signals, e.g., a system clock signal CK, a data clock signal WCK, and a read clock signal RDQS. Clock signals CK_t and CK_c are used for timings for providing and receiving a command and an address. Clock signals WCK_t and WCK_c are used for timings for providing data. The clock signals CK_t and CK_c are complementary with each other, and the clock signals WCK_t and WCK_c are complementary with each other. Clock signals are complementary with each other when a rising edge of a first clock signal coincides with a falling edge of a second clock signal and a rising edge of the second clock signal coincides with a falling edge of the first clock signal. The clock signals WCK_t and WCK_c provided to the chiplet DRAMs 401 and 402 by the memory controller 220 may be synchronized with the clock signals CK_t and CK_c provided to the chiplet DRAMs 401 and 402 by the memory controller 220. Also, the clock signals WCK_t and WCK_c may have a higher clock frequency than the clock signals CK_t and CK_c. For example, the clock signals WCK_t and WCK_c have a clock frequency that is four times the clock frequency of the clock signals CK_t and CK_c. Hereinafter, for convenience of explanation, the clock signals CK_t and CK_c may be referred to as clock signals CK, and the clock signals WCK_t and WCK_c may be referred to as clock signals WCK.

According to the UCI interface 240 including 16 lanes, the chiplet DRAMs 401 and 402 may each be connected to 8 lanes. In this regard, connectivity with the 16 lanes of the UCI interface 240 may be implemented by using the two chiplet DRAMs 401 and 402. In embodiments below, to implement a chiplet architecture according to the UCI interface, chiplet DRAMs corresponding to the lane specification of an xP UCI interface 240 (e.g., various numbers of lanes like P=2, 4, 8, and so on) will be provided, and an interconnect for controlling correlation between lanes of the UCI interface 240 and the chiplet DRAMs connected to the lane will be described.

Figure 5A:
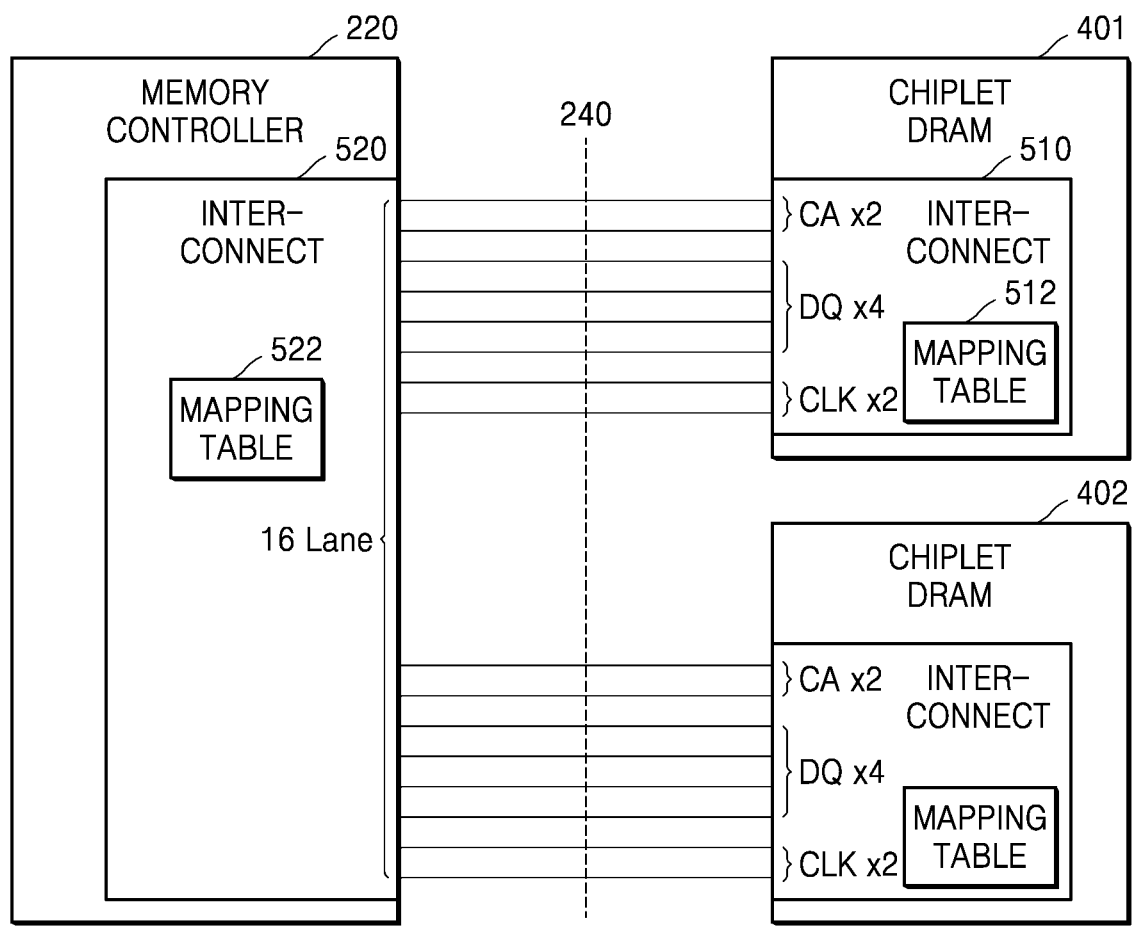
FIGS. 5A and 5B are diagrams for describing UCI interconnects according to example embodiments.
Figures 5B, 6:
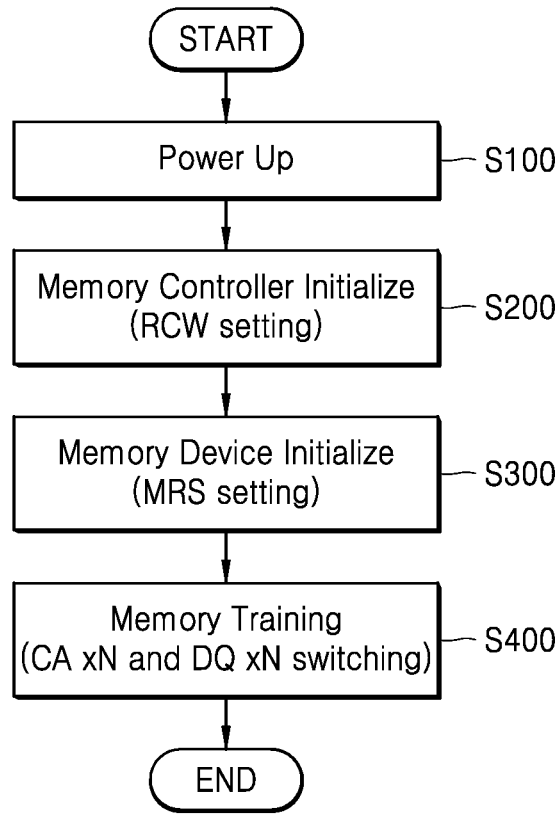
FIG. 6 is a diagram for describing a UCI mapping table according to example embodiments.

FIGS. 5A and 5B are diagrams for describing UCI interconnects according to example embodiments. FIG. 5A is a block diagram for describing UCI interconnects 510 and 520 connected to the UCI interface 240 in connection with FIGS. 2 and 4, and FIG. 5B is a flow diagram for describing the operation of the UCI interconnects 510 and 520 of FIG. 5A.

Referring to FIG. 5A, the memory controller 220 of the host processor 120 may include a UCI interconnect 520 providing the UCI interface 240. The UCI interconnect 520 may provide the UCI interface 240 between the memory controller 220 and the chiplet DRAMs 401 and 402. The UCI interconnect 520 may include a physical layer and a link layer. The physical layer of the UCI interconnect 520 may include physical elements for exchanging data with the chiplet DRAMs 401 and 402 and may include at least one transmitter TX and at least one receiver RX. The link layer of the UCI interconnect 520 may manage transmission and combination of data and may also manage integrity and errors of data. The UCI interconnect 520 of the memory controller 220 may include, for example, 16 lanes.

The chiplet DRAMs 401 and 402 may each include a UCI interconnect 510 providing the UCI interface 240 between the chiplet DRAMs 401 and 402 and the memory controller 220. The UCI interconnect 510 may include a physical layer and a link layer. The physical layer of the UCI interconnect 510 may include physical elements for exchanging data with the memory controller 220 and may include at least one receiver RX and at least one transmitter TX. The link layer of the UCI interconnect 510 may manage transmission and combination of data and may manage integrity and errors of data. The UCI interconnect 510 of each of the chiplet DRAMs 401 and 402 may include, for example, 8 lanes.

According to an embodiment, physical layers and link layers of the UCI interconnects 510 and 520 may be defined by the "UCIe" specification. The link layers of the UCI interconnects 510 and 520 may each include a physical adapted layer, wherein the physical adapted layer may control physical layers by managing data symbols or power.

The UCI interconnect 520 of the memory controller 220 may include a logic circuit 522 for setting the number of chiplet DRAMs connected to 16 lanes and information regarding signal pins connected to the lanes from among a plurality of signal pins included in connected chiplet DRAMs. The logic circuit 522 may include a mapping table configured to indicate or set a correlation between the number of connected chiplet DRAMs and connected signal pins. Hereinafter, for convenience of explanation, the logic circuit 522 will be referred to as a mapping table 522. The mapping table 522 may be implemented with registers (or storage elements) configured to indicate that there are 2 connected chiplet DRAMs connected to 16 lanes and connected signal pins of each chiplet DRAM include 2 CA pins and 4 DQ pins.

The UCI interconnect 510 of each of the chiplet DRAMs 401 and 402 may include a mapping table configured identically to the mapping table 522 of the memory controller 220 in a logic circuit 512. The logic circuit 512 may be referred to as a mapping table 512, and the mapping table 512 may be implemented with registers (or storage elements) indicating that there are 2 connected chiplet DRAMs connected to 16 lanes and connected signal pins of each chiplet DRAM include 2 CA pins and 4 DQ pins. The UCI interconnect 510 may perform a switching operation for connecting 2 CA pins from among a plurality of CA pins of the chiplet DRAMs 401 and 402 and 4 DQ pins from among a plurality of DQ pins of the chiplet DRAMs 401 and 402 to lanes of the UCI interface 240. Before the switching operation of the chiplet DRAMs 401 and 402, it may be necessary for the UCI interconnect 520 of the memory controller 220 and the UCI interconnect 510 of each of the chiplet DRAMs 401 and 402 to set mapping tables 522 and 512 regarding the UCI interface 240 identically. The UCI interconnect 510 of each of the chiplet DRAMs 401 and 402 may perform a switching operation for connecting 2 CA pins and 4 DQ pins selected based on the mapping table 512 to lanes of the UCI interface 240. Therefore, 16 lanes through which the memory controller 220 and the chiplet DRAMs 401 and 402 may stably exchange data with each other may be set to an interconnected state.

Referring to FIG. 5B, power may be supplied to the system 100, and thus the system 100 may be powered up (operation S100). After the system 100 is powered-up, the memory controller 220 may set a register control word (RCW) for initialization of the chiplet DRAMs 401 and 402 and/or controlling the chiplet DRAMs 401 and 402 to suit the operating characteristics thereof (operation S200). An RCW may include various algorithms to configure the memory controller 220, such that the memory controller 220 and the chiplet DRAMs 401 and 402 normally interoperate with each other. For example, codes indicating a frequency, a timing, a driving strength, and detailed operation parameters of the chiplet DRAMs 401 and 402 may be set to the RCW. UCI codes indicating the number of connected chiplet DRAMs and the number of connected signal pins selected from the mapping table 522 according to the specifications of the system 100 may be stored in the RCW. For systems with high-capacity memory specifications, an RCW code may be configured to use 10 chiplet DRAMs implemented with x2 connected CA pins and x4 connected DQ pins (FIG. 7) to provide a high-capacity solution. For latency-sensitive systems, an RCW code may be configured to use 2 chiplet DRAMs implemented with x8 connected CA pins and x16 connected DQ pins (FIG. 11) to provide a high-performance solution.

The chiplet DRAMs 401 and 402 may each set a mode register set (MRS) for setting the number of CA pins, the number of DQ pins, a plurality of operation options, various functions, characteristics, and modes of the chiplet DRAMs 401 and 402 (operation S300). An MRS may be used to control a burst length BL, a CAS latency CL, etc. The burst length BL may be provided to set the maximum number of column locations that may be accessed for a read command and/or a write command. The CAS latency CL may be provided to define a clock cycle delay between a read command and a first bit of valid output data. Similar to UCI codes stored in the RCW of the memory controller 220, UCI codes indicating the number of connected chiplet DRAMs and the number of connected signal pins selected from the mapping table 512 may be stored in the MRS.

Thereafter, memory training for the chiplet DRAMs 401 and 402 may be performed by the memory controller 220 (operation S400). The memory training may include a switching operation of connecting xN CA pins and xM DQ pins selected from the mapping table 512 by the UCI interconnect 510 of the chiplet DRAMs 401 and 402 to lanes of the UCI interface 240. Also, the memory training may include tasks like clock training, write leveling, write deskew, and write centering associated with write operations of the chiplet DRAMs 401 and 402.

The clock training may be performed, such that xN CA signals and/or CA patterns transmitted from the memory controller 220 are accurately captured by the chiplet DRAMs 401 and 402 based on the clock signal CK. Also, the clock training may be performed, such that write data DQ transmitted from the memory controller 220 are accurately captured by the chiplet DRAMs 401 and 402 based on the clock signal WCK. The write leveling may be trained to adjust the delay time of the clock signal WCK by sampling the clock signal WCK transmitted from the memory controller 220 based on the clock signal CK and detecting a phase relationship between the clock signal CK and the clock signal WCK.

The write deskew may be trained to reduce a data input time difference between a plurality of pieces of data DQs transmitted from the memory controller 220 through a data DQ bus of the UCI interface 240. Since the effective data window decreases when a skew between pieces of the write data DQ increases in a write mode, the chiplet DRAMs 401 and 402 may perform a write data deskew operation to compensate for a data skew to secure the valid data margin. According to some embodiments, since the effective data window decreases when a skew between pieces of read data DQ increases in a read mode, the chiplet DRAMs 401 and 402 may perform a read data deskew operation to compensate for a data skew to secure the valid data margin.

The write centering may be trained, such that the edge of the clock signal WCK is centered on a write data DQ window regarding the write data DQ transmitted from the memory controller 220 through the data DQ bus of the UCI interface 240. According to embodiments, the chiplet DRAMs 401 and 402 may be trained, such that the edge of read data DQ is centered on a read data DQ window regarding the read data DQ transmitted to the memory controller 220 in a read mode.

The chiplet DRAMs 401 and 402 may complete memory training and store optimized operation parameters in a parameter storage region. The parameter storage region may be, for example, an extended mode register set (EMRS), a separate parameter register, or a non-volatile memory, e.g., a flash memory, an EPROM, or an EEPROM. The chiplet DRAMs 401 and 402 may write or read data in an environment set according to optimized operation parameters stored in the parameter storage region.

FIG. 6 is a diagram for describing a UCI mapping table according to example embodiments. A UCI mapping table 600 of FIG. 6 may be configured as a lookup table that is combined according to the number of CA pins and the number of DQ pins of the connected chiplet DRAMs to provide mapping of the number of connected chiplet DRAMs with respect to, for example, a UCI interface including 64 lanes. The UCI interface including 64 lanes may correspond to the UCI interface 240 described above in FIG. 5A. The UCI mapping table of FIG. 6 is a non-limiting example for explanatory purposes.

Referring to FIG. 6, the UCI mapping table 600 shows mapping of the number of connected chiplet DRAMs regarding 2 (x2), 4 (x4), 8 (x8), 16 (x16), and 32 (x32) DQ pins respectively corresponding to 1 (x1), 2 (x2), 4 (x4), 8 (x8), and 16 (x16) CA pins of connected chiplet DRAMs for the UCI interface including 64 lanes. As a first example, 10 connected chiplet DRAMs each including 2 CA pins and 4 DQ pins may be interconnected to the UCI interface including 64 lanes, wherein detailed description thereof will be given below with reference to FIGS. 7 to 10. As a second example, 2 connected chiplet DRAMs each including 8 CA pins and 16 DQ pins may be interconnected to the UCI interface including 64 lanes, wherein detailed description thereof will be given below with reference to FIGS. 11 to 14.

Figure 7:
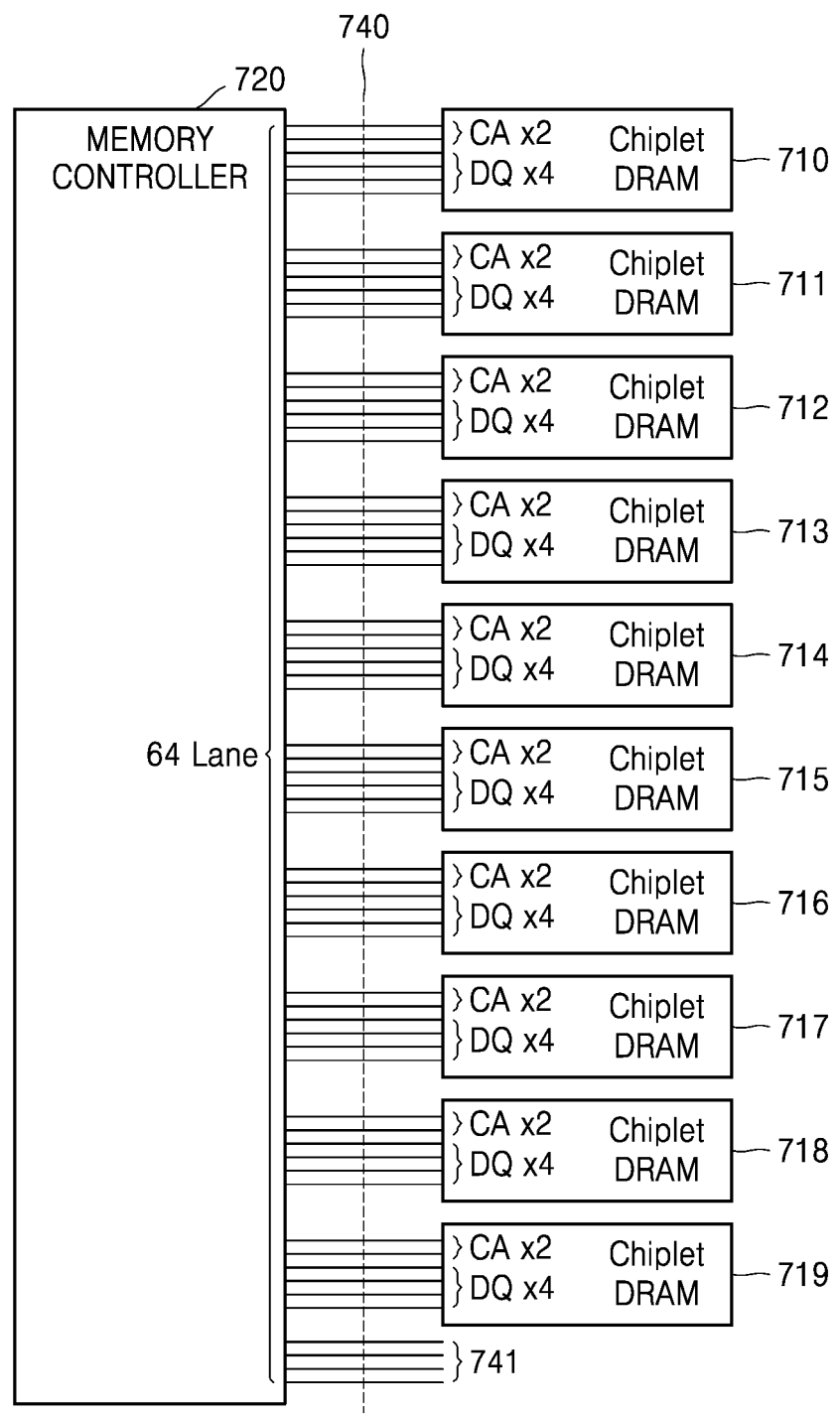
Figure 9:
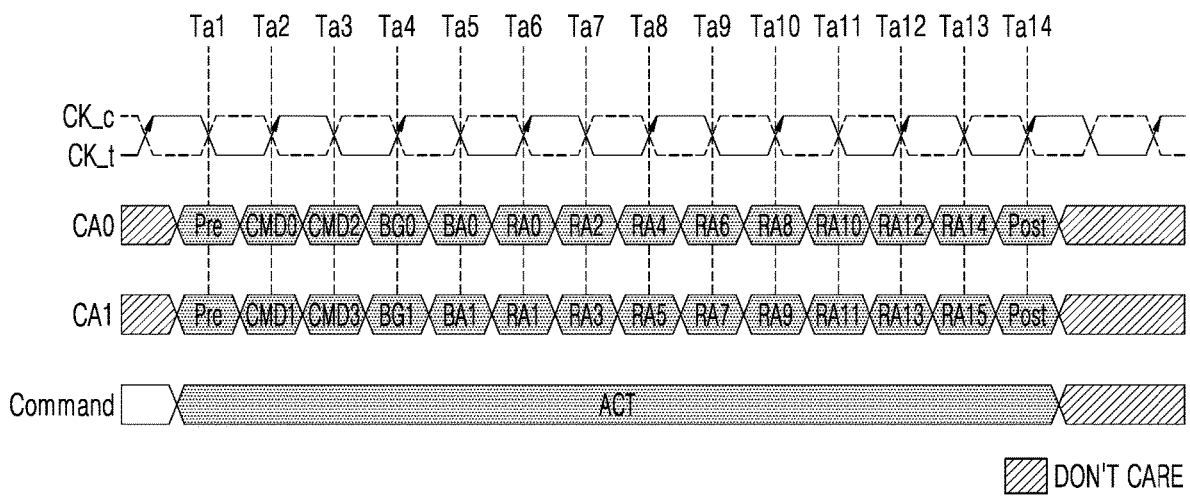
Figure 10:
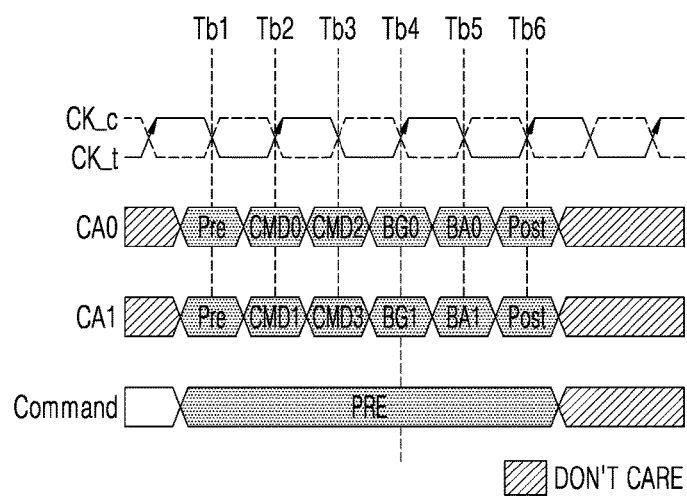

FIGS. 7 to 10 are diagrams for describing a UCI interconnect according to example embodiments. FIG. 7 shows a chiplet architecture regarding a UCI interface 740 including 64 lanes, in which connected chiplet DRAMs 710 to 719 each including 2 CA pins and 4 DQ pins are interconnected to a memory controller 720 according to the UCI mapping table 600 of FIG. 6. FIG. 8 shows a command diagram of each of the connected chiplet DRAMs 710 to 719 of FIG. 7, and FIGS. 9 and 10 illustrate timing diagrams associated with commands of FIG. 8. In timing diagrams shown below, the horizontal axis and the vertical axis represent time and voltage levels, respectively, and are not necessarily drawn to scale.

Referring to FIG. 7, the memory controller 720 and the 10 connected chiplet DRAMs 710 to 719 may be connected to the UCI interface 740 including 64 lanes. The memory controller 720 may include the UCI interconnect 520 (FIG. 5A) providing the UCI interface 740, and each of the connected chiplet DRAMs 710 to 719 may also be configured to include the UCI interconnect 510 (FIG. 5A) providing the UCI interface 740. The connected chiplet DRAMs 710 to 719 may include the same dies, may each include 2 CA pins and 4 DQ pins, and may each be connected to 6 lanes of the UCI interface 740. Therefore, the 10 connected chiplet DRAMs 710 to 719 may be connected to 60 lanes from among 64 lanes of the UCI interface 740.

The remaining 4 lanes of the UCI interface 740 may be used as redundant lanes (or spare lanes) to handle defective lanes (including clock signals, sidebands, etc.). A redundant sideband interface 741 is used for parameter exchange between the memory controller 720 and the connected chiplet DRAMs 710 to 719 and may also be used for access for debug/compliance and training and management of a UCIe link. In some embodiments, the redundant sideband interface 741 may be implemented based on a result of test operation of communicating between the memory controller 720 and the connected chiplet DRAMs 710 to 719 by using the UCI interface 740. For example, a connection of the redundant sideband interface 741 may be switched to one or more corresponding chiplet DRAMs 710 to 719 during the test operation.

Referring to FIGS. 7 and 8, a diagram T800 of an active command ACT and a precharge command PRE is shown. Operands of the active command ACT and the precharge command PRE are provided from column addresses CA[0] and CA[1].

For the active command ACT, operands are provided from the column addresses CA[0] and CA[1] at a first rising edge R1 of the clock signal CK, and additional operands may be input at a first falling edge F1 of the clock signal CK, a second rising edge R2 of the clock signal CK, a second falling edge F2 of the clock signal CK, a third rising edge R3 of the clock signal CK, a third falling edge F3 of the clock signal CK, a fourth rising edge R4 of the clock signal CK, a fourth falling edge F4 of the clock signal CK, a fifth rising edge R5 of the clock signal CK, and a fifth falling edge F5 of the clock signal CK. The operands (variables, fields, or values indicating particular aspects of the active command ACT) may include BG0 to BG1, BA0 to BA1, and RA0 to RA15 provided according to the DRAM specification. BG0 to BG1 may indicate bank group addresses, BA0 to BA1 may indicate bank addresses, and RA0 to RA15 may indicate row addresses.

For the precharge command PRE, operands are provided from column addresses CA[0] and CA[1] at a first rising edge R1 of the clock signal CK, and additional operands may be input at a first falling edge F1 of the clock signal CK. The operands (variables, fields, or values indicating particular aspects of the precharge command PRE) may include BG0 to BG1, and BA0 to BA1 provided according to the DRAM specification.

Referring to FIG. 9, for an active operation of each of the connected chiplet DRAMs 710 to 719, a preamble signal Pre synchronized with the clock signal CK may be applied through pins of the column addresses CA[0] and CA[1] at a time point Ta1, and active preparation signals CMD0 to CMD3 synchronized with the clock signal CK may be applied through the pins of the column addresses CA[0] and CA[1] at time points Ta2 and Ta3. An unknown signal period may exist before the preamble signal Pre, and an unknown signal period may also exist after a postamble signal Post. The active preparation signals CMD0 to CMD3 applied after the level of the preamble signal Pre is changed may serve as CAS, CS, RAS, and WE commands to prepare for an active operation. Operands of the active command ACT synchronized with the clock signal CK may be applied through the pins of the column addresses CA[0] and CA[1] from a time point Ta4 to a time point Ta13. The postamble signal Post synchronized with the clock signal CK may be applied through the pins of the column addresses CA[0] and CA[1] at a time point Ta14. Therefore, in the timing diagram of FIG. 9, it may be configured that the active command ACT needs 14 clock signal edges from the time point Ta1 to the time point Ta14.

Referring to FIG. 10, for a precharge operation of each of the connected chiplet DRAMs 710 to 719, a preamble signal Pre synchronized with the clock signal CK may be applied through the pins of the column addresses CA[0] and CA[1] at a time point Tb1, and precharge preparation signals CMD0 to CMD3 synchronized with the clock signal CK may be applied through the pins of the column addresses CA[0] and CA[1] at time points Tb2 and Tb3. The precharge preparation signals CMD0 to CMD3 may serve as CAS, CS, RAS, and WE commands for preparing a precharge operation. Operands of the precharge command PRE synchronized with the clock signal CK may be applied through the pins of the column addresses CA[0] and CA[1] from a time point Tb4 to a time point Tb5. The postamble signal Post synchronized with the clock signal CK may be applied through the pins of the column addresses CA[0] and CA[1] at a time point Tb6. Therefore, in the timing diagram of FIG. 10, it may be configured that the precharge command PRE needs 6 clock signal edges from the time point Tb1 to the time point Tb6.

Figures 11, 12:
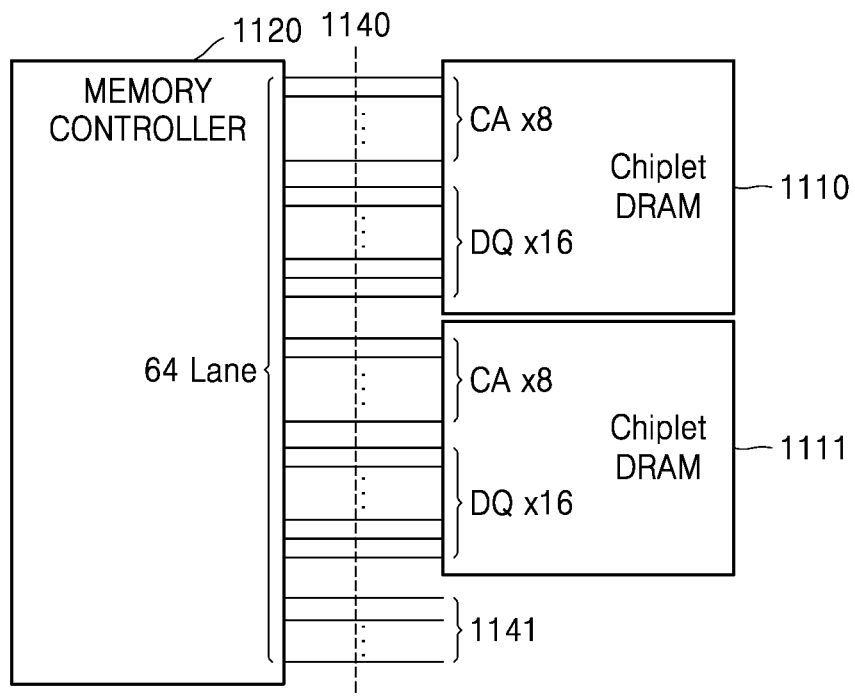
FIGS. 11 to 14 are diagrams for describing a UCI interconnect according to example embodiments.
Figure 13:
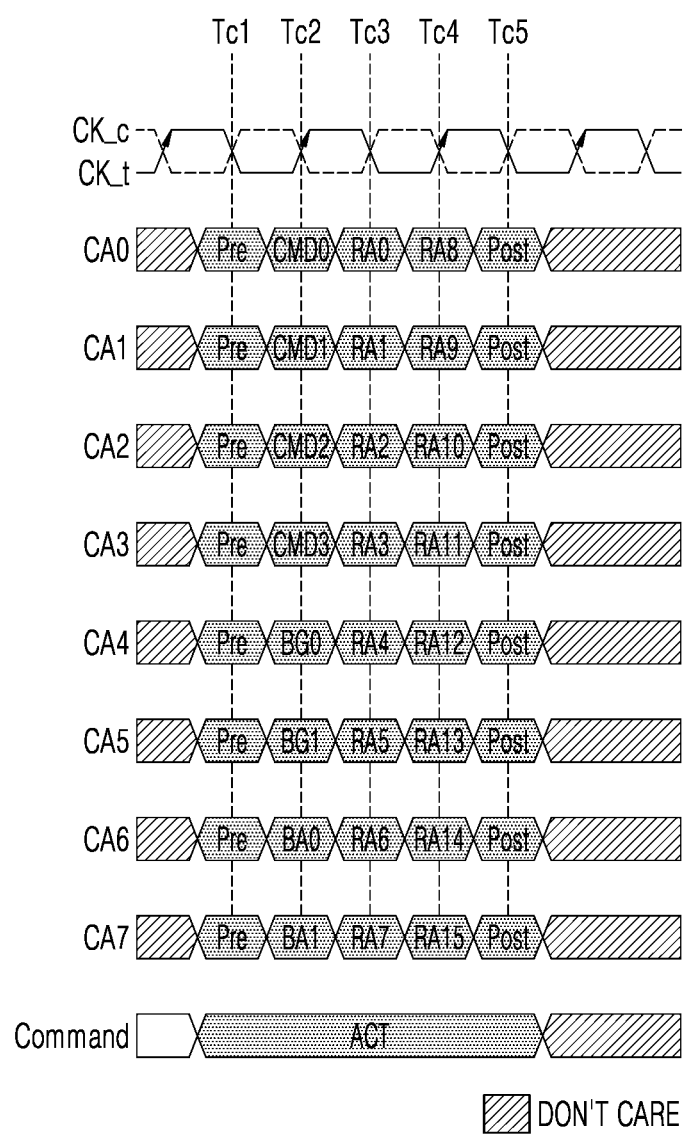
Figure 14:
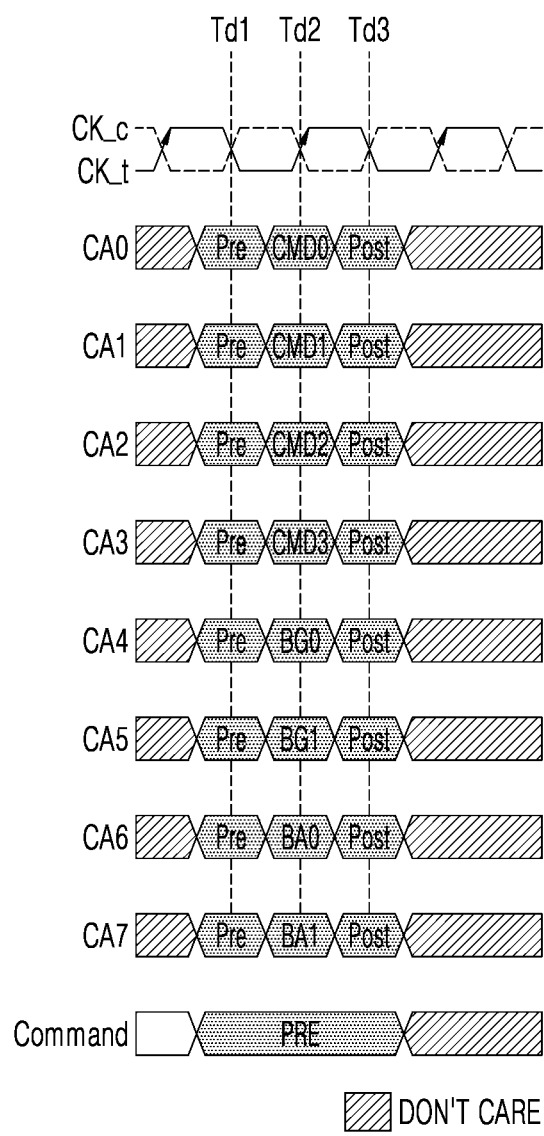

FIGS. 11 to 14 are diagrams for describing a UCI interconnect according to example embodiments. FIG. 11 shows a chiplet architecture regarding a UCI interface 1140 including 64 lanes, in which 2 connected chiplet DRAMs 1110 and 1111 each including 8 CA pins and 16 DQ pins are interconnected to a memory controller 1120 according to the UCI mapping table 600 of FIG. 6. FIG. 12 shows a command diagram of each of the connected chiplet DRAMs 1110 and 1111 of FIG. 11, and FIGS. 13 and 14 illustrate timing diagrams associated with commands of FIG. 12.

Referring to FIG. 11, the memory controller 1120 and the 2 connected chiplet DRAMs 1110 and 1111 may be connected to the UCI interface 1140 including 64 lanes. The memory controller 1120 may include the UCI interconnect 520 (FIG. 5A) providing the UCI interface 1140, and each of the connected chiplet DRAMs 1110 and 1111 may also be configured to include the UCI interconnect 510 (FIG. 5A) providing the UCI interface 1140. The connected chiplet DRAMs 1110 and 1111 may include the same dies, may each include 8 CA pins and 16 DQ pins, and may each be connected to 24 lanes of the UCI interface 1140. Therefore, the 2 connected chiplet DRAMs 1110 and 1111 may be connected to 48 lanes from among 64 lanes of the UCI interface 1140. The remaining 16 lanes of the UCI interface 1140 may be used as redundant lanes, and a redundant sideband interface 1141 may be used for parameter exchange between the memory controller 1120 and the connected chiplet DRAMs 1110 and 1111 and may be used for access for debug/compliance and coordination with a remote partner for training and management of a UCIe link.

Referring to FIGS. 11 and 12, a diagram T1200 of the active command ACT and the precharge command PRE is shown. Operands of the active command ACT and the precharge command PRE are provided from a column address CA[0:7].

For the active command ACT, operands are provided from the column address CA[0:7] at a first rising edge R1 of the clock signal CK, and additional operands may be input at a first falling edge F1 of the clock signal CK and a second rising edge R2 of the clock signal CK. The operands (variables, fields, or values indicating particular aspects of the active command ACT) may include BG0 to BG1, BA0 to BA1, and RA0 to RA15 provided according to the DRAM specification. V represents a high (H) or low (L) valid signal, which may be related to the active preparation signals CMD0 to CMD3 (FIG. 13).

For the precharge command PRE, operands may be provided from the column address CA[0:7] at the first rising edge R1 of the clock signal CK. The operands (variables, fields, or values indicating particular aspects of the precharge command PRE) may include BG0 to BG1 and BA0 to BA1 provided according to the DRAM specification.

Referring to FIG. 13, for an active operation of each of the chiplet DRAMs 1110 and 1111, a preamble signal Pre synchronized with the clock signal CK may be applied at a time point Tc1, and active preparation signals CMD0 to CMD3 synchronized with the clock signal CK may be applied through pins of the column address CA[0:3] at a time point Tc2. Operands of the active command ACT synchronized with the clock signal CK may be applied through pins of the column address CA[4:7] at a time point Tc2 and through the pins of the column address CA[0:7] from a time point Tc3 to a time point Tc4, and the postamble signal Post synchronized with the clock signal CK may be applied through the pins of the column address CA[0:7] at a time point Tc5. In the timing diagram of FIG. 13, it may be configured that the active command ACT needs 5 clock signal edges from the time point Tc1 to the time point Tc5.

Referring to FIG. 14, for a precharge operation of each of the chiplet DRAMs 1110 and 1111, a preamble signal Pre synchronized with the clock signal CK may be applied through the pins of the column address CA[0:7] at a time point Td1, and precharge preparation signals CMD0 to CMD3 synchronized with the clock signal CK through the pins of the column address CA[0:3] at a time point Td2. Operands of the precharge command PRE synchronized with the clock signal CK may be applied through the pins of the column address CA[4:7] at the time point Td2, and the postamble signal Post may be applied through the pins of the column address CA[0:7] at a time point Td3. Therefore, in the timing diagram of FIG. 14, it may be configured that the precharge command PRE needs 3 clock signal edges from the time point Td1 to the time point Td3.

In the timing diagrams for setting the active command ACT for 64 lanes of each of UCI interfaces 740 and 1140 of FIGS. 7 and 11 described above, it may be seen that the active command ACT of FIG. 9 needs 14 clock signal edges from the time point Ta1 to the time point Ta14 for the 10 connected chiplet DRAMs 710 to 719, and the active command ACT of FIG. 13 needs 5 clock signal edges from the time point Tc1 to the time point Tc5 for the 2 connected chiplet DRAMs 1110 and 1111. Since the active command ACT of FIG. 9 has a relatively long latency, it may act as a burden on a high-speed operation performance, but the 10 connected chiplet DRAMs 710 to 719 may provide a high-capacity memory. Therefore, the 10 connected chiplet DRAMs 710 to 719 each implemented with x2 connected CA pins and x4 connected DQ pins and connected to 64 lanes of the UCI interface 740 of FIG. 7 may provide a high-capacity solution for a system. Since the active command ACT of FIG. 13 has a relatively short latency, it may provide high-speed operation performance. Therefore, the 2 connected chiplet DRAMs 1110 and 1111 (FIG. 11) each implemented with x8 connected CA pins and x16 connected DQ pins and connected to 64 lanes of the UCI interface 1140 of FIG. 11 may be employed in a latency-sensitive system.

Figure 15:
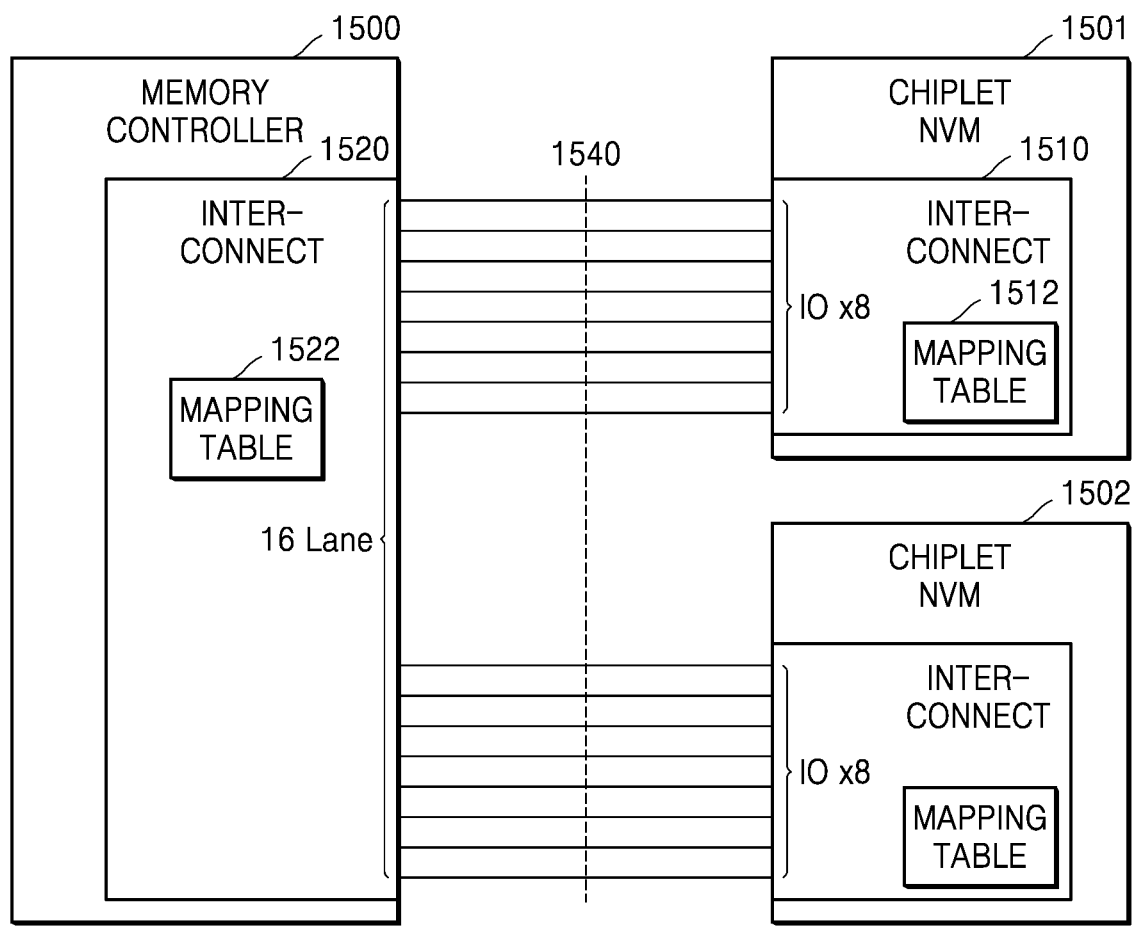
FIG. 15 is a diagram for describing a UCI interconnect according to example embodiments.

FIG. 15 is a diagram for describing a UCI interconnect according to example embodiments. FIG. 15 illustrates a UCI interface 1540 connected between a memory controller 1500 and a chiplet non-volatile memory (NVM). The chiplet NVM may be implemented with a flash memory or a resistive memory like a phase change RAM (PRAM), a magnetic RAM (MRAM), and a resistive RAM (RRAM).

Referring to FIG. 15, the memory controller 1500 may include a UCI interconnect 1520 providing the UCI interface 1540. The UCI interconnect 1520 may provide the UCI interface 1540 between the memory controller 1500 and chiplet NVMs 1501 and 1502. The UCI interconnect 1520 may include a physical layer and a link layer, wherein the physical layer may include physical elements for exchanging data with the chiplet NVMs 1501 and 1502 and include at least one transmitter TX and at least one receiver RX. The link layer of the UCI interconnect 1520 may manage transmission and combination of data and may manage integrity and errors of data. The UCI interconnect 1520 of the memory controller 1500 may include, for example, 16 lanes.

The chiplet NVMs 1501 and 1502 may each include a UCI interconnect 1510 providing the UCI interface 1540 between the chiplet NVMs 1501 and 1502 and the memory controller 1500. The UCI interconnect 1510 may include a physical layer and a link layer. The physical layer of the UCI interconnect 1510 may include physical elements for exchanging data with the memory controller 1500 and may include at least one receiver RX and at least one transmitter TX. The link layer of the UCI interconnect 1510 may manage transmission and combination of data and may manage integrity and errors of data. The UCI interconnect 1510 of each of the chiplet NVMs 1501 and 1502 may include, for example, 8 lanes.

The UCI interconnect 1520 of the memory controller 1500 may include a logic circuit 1522 for setting the number of connected chiplet NVM(s) connected to 16 lanes and information regarding signal pins connected to the lanes from among a plurality of signal pins included in connected chiplet NVM(s). The logic circuit 1522 may include a mapping table configured to indicate or set a correlation between the number of connected chiplet NVMs and connected signal pins. The mapping table of the logic circuit 1522 may be implemented with registers (or storage elements) configured to indicate that there are 2 chiplet NVMs connected to 16 lanes and connected signal pins of each connected chiplet NVM include 8 input/output signal (IO) pins. Herein, for convenience of explanation, each of the chiplet NVMs 1501 and 1502 may include IO pins.

The UCI interconnect 1510 of each of the connected chiplet NVMs 1501 and 1502 may include a mapping table configured identically to a mapping table 1522 of the memory controller 1500 in a logic circuit 1512. In some examples, the mapping tables of the logic circuits 1512 and 1522 may be set to the same information, however, components of the configuration constituting each of the logic circuits 1512 and 1522 may be different from each other. The mapping table of the logic circuit 1512 may be implemented with registers (or storage elements) configured to indicate that there are 2 connected chiplet NVMs connected to 16 lanes and connected signal pins of each chiplet NVM include 8 IO pins. The UCI interconnect 1510 may perform a switching operation for connecting 8 IO pins from among a plurality of IO pins of the connected chiplet NVMs 1501 and 1502 to lanes of the UCI interface 1540. Before the switching operation of the connected chiplet NVMs 1501 and 1502, it may be necessary for the UCI interconnect 1520 of the memory controller 1500 and the UCI interconnect 1510 of each of the connected chiplet NVMs 1501 and 1502 to set mapping tables regarding the UCI interface 1540 identically. The UCI interconnect 1510 of each of the chiplet NVMs 1501 and 1502 may perform a switching operation of connecting 8 IO pins selected based on a mapping table of the logic circuit 1512 to lanes of the UCI interface 1540. Therefore, 16 lanes through which the memory controller 1500 and the connected chiplet NVMs 1501 and 1502 may stably exchange data with each other may be set to an interconnected state.

Figure 16:
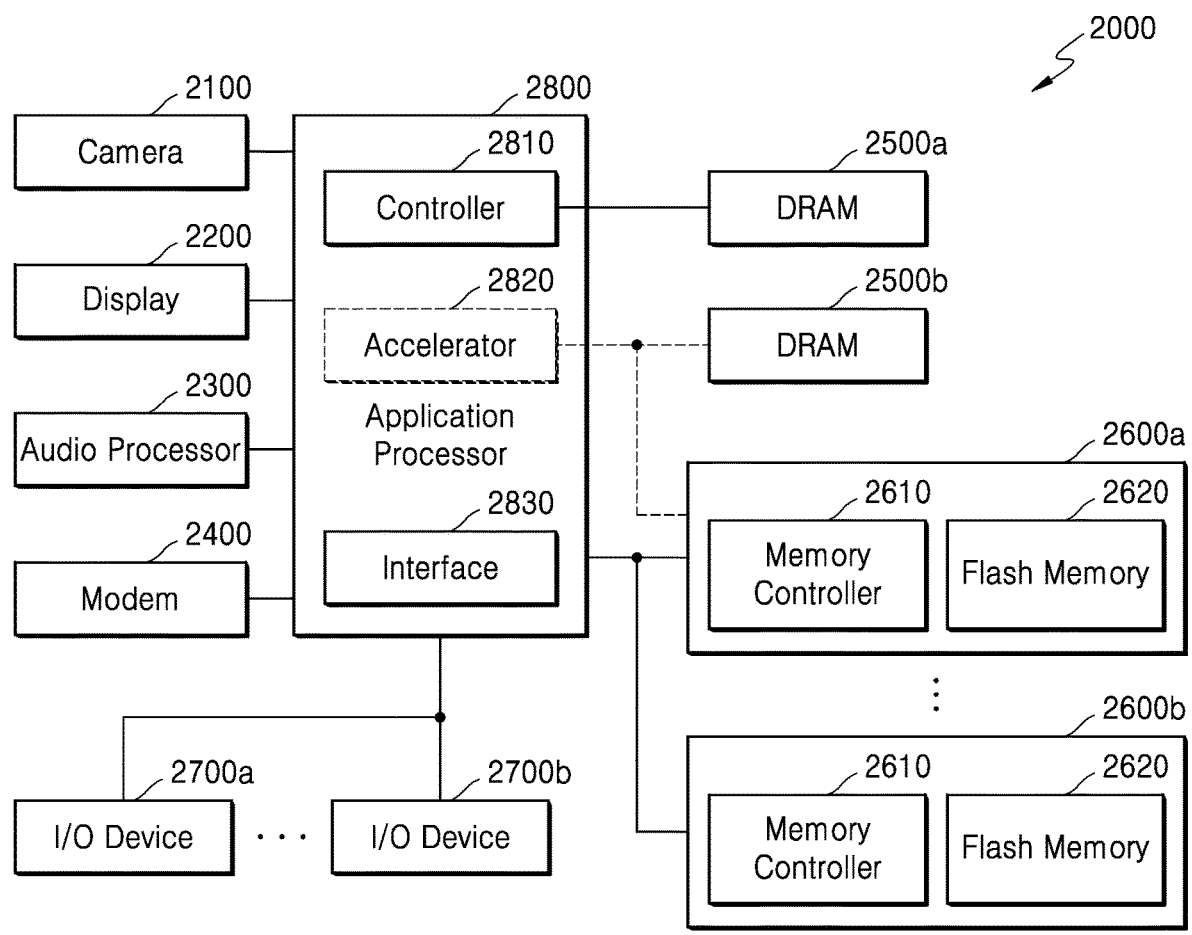
FIG. 16 is a block diagram of a system for describing an electronic device including a die-to-die (D2D) interface according to example embodiments.

FIG. 16 is a block diagram of a system for describing an electronic device including a die-to-die (D2D) interface according to example embodiments.

Referring to FIG. 16, a system 2000 may include a camera 2100, a display 2200, an audio processor 2300, a modem 2400, DRAMs 2500a and 2500b, storage devices 2600a and 2600b, I/O devices 2700a and 2700b, and an application processor (AP) 2800. The system 2000 may be implemented as a laptop computer, a mobile phone, a smartphone, a tablet personal computer (PC), a wearable device, a healthcare device, or an Internet Of Things (IOT) device. Also, the system 2000 may be implemented as a server or a PC.

The camera 2100 may capture a still image or a video according to a user's control and may store captured image/video data or transmit the captured image/video data to the display 2200. The audio processor 2300 may process audio data included in the storage devices 2600a and 2600b or network content. The modem 2400 may transmit a modulated signal for wired/wireless data transmission/reception to a receiver and the modulated signal may be demodulated by the receiver to restore an original signal. The I/O devices 2700a and 2700b may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 2800 may control the overall operation of the system 2000. The AP 2800 may include a control block 2810, an accelerator block or accelerator chip 2820, and an interface block 2830. The AP 2800 may control the display 2200, such that a part of content stored in the storage devices 2600a and 2600b is displayed on the display 2200. When a user input is received through the I/O devices 2700a and 2700b, the AP 2800 may perform a control operation corresponding to the user input. The AP 2800 may include an accelerator block, which is a circuit dedicated for calculation of Artificial Intelligence (AI) data, or may include an accelerator chip 2820 separately from the AP 2800. The DRAM 2500b may be additionally provided in the accelerator block or the accelerator chip 2820. The accelerator block is a functional block that specializes in performing a particular function of the AP 2800 and may include a GPU, which is a functional block that specializes in processing graphic data, a neural processing unit (NPU), which is a block that specializes in AI calculation and inference, and a data processing unit (DPU), which is a block that specializes in data transmission.

The system 2000 may include a plurality of DRAMs 2500a and 2500b. The AP 2800 may set up a DRAM interface protocol and communicate with the DRAMs 2500a and 2500b to control the DRAMs 2500a and 2500b through commands complying with the Joint Electron Device Engineering Council (JEDEC) standard and mode register (MRS) setting or to use company-specific functions like low voltage/high-speed/reliability and a cyclic redundancy check (CRC)/error correction code (ECC) function. For example, the AP 2800 may communicate with the DRAM 2500a through an interface complying with the JEDEC standards like LPDDR4 and LPDDR5, and the accelerator block or the accelerator chip 2820 may set and use a new DRAM interface protocol to control the DRAM 2500b for an accelerator, which has a greater bandwidth than the DRAM 2500a.

Although FIG. 16 shows only the DRAMs 2500a and 2500b, the inventive concept is not limited thereto. As long as a bandwidth, a response speed, and voltage conditions of the AP 2800 or the accelerator chip 2820 are satisfied, any memory like a PRAM, an SRAM, an MRAM, an RRAM, an FRAM, or a Hybrid RAM may be used. The DRAMs 2500a and 2500b have relatively smaller latency and bandwidth than the I/O devices 2700a and 2700b or the storage devices 2600a and 2600b. The DRAMs 2500a and 2500b are initialized when the system 2000 is powered on and the OS and application data are loaded thereto, and thus the DRAMs 2500a and 2500b may be used as temporary storages for the OS and the application data or may be used as execution spaces for various software code.

In the DRAMs 2500a and 2500b, four arithmetic operations (i.e., addition, subtraction, multiplication, and division), vector calculations, address calculations, or Fast Fourier Transform (FFT) calculations may be performed. Also, in the DRAMs 2500a and 2500b, a function for an operation used for an inference may be performed. Here, the inference may be performed in a deep learning algorithm using an artificial neural network. The deep learning algorithm may include a training operation for learning a model through various data and an inference operation for recognizing data with the trained model. According to an embodiment, an image captured by a user through the camera 2100 is signal-processed and stored in the DRAM 2500b, and the accelerator block or accelerator chip 2820 may perform AI data calculation for recognizing data using data stored in the DRAM 2500b and a function used for inference.

The system 2000 may include a plurality of storage devices 2600a and 2600b having a larger capacity than the DRAMs 2500a and 2500b. The accelerator block or accelerator chip 2820 may perform a training operation and an AI data calculation using the storage devices 2600a and 2600b. According to an embodiment, the storage devices 2600a and 2600b may include a memory controller 2610 and a flash memory 2620, and a training operation and an inference AI data calculation performed by the AP 2800 and/or the accelerator chip 2820 may be performed more efficiently by using an arithmetic unit included in the memory controller 2610. The storage devices 2600a and 2600b may store images captured through the camera 2100 or data transmitted through a data network. For example, the storage devices 2600a and 2600b may store Augmented Reality/Virtual Reality content, High Definition (HD) content, or Ultra High Definition (UHD) content.

In the system 2000, the AP 2800 and the DRAMs 2500a and 2500b and the AP 2800 and the storage devices 2600a and 2600b may be connected to each other through the D2D interface described with reference to FIGS. 1 to 15. Also, the memory controller 2610 and the flash memory 2620 of the storage devices 2600a and 2600b may be connected to each other through a D2D interface. The D2D interface may support a CXL protocol or a UCIe protocol for communication between a first die and a second die. The first die may include a first interconnect that provides first lanes communicating with the second die to the D2D interface. The second die may include a plurality of connected chiplet dies communicating with the first die, and each of the plurality of connected chiplet dies may include a second interconnect that provides second lanes to the D2D interface. Each of the first interconnect and the second interconnect may include a logic circuit configured to indicate or store a correlation between the number of connected chiplet dies connected to the first lanes and connected signal pins from among a plurality of signal pins of each of the connected chiplet dies. According to an embodiment, a large number of chiplet memories implemented with a relatively small number of connected signal pins (e.g., command/address (CA) pins and data (DQ) pins) based on a mapping table of the logic circuit may provide a high-capacity memory solution for the D2D interface. According to another embodiment, a small number of chiplet memories implemented with a relatively large number of connected CA pins and connected DQ pins based on a mapping table of the logic circuit may provide a high-speed and high-performance solution for the D2D interface.

While the inventive concept has been particularly shown and described with reference to embodiments thereof, it will be understood that various changes in form and details may be made therein without departing from the spirit and scope of the following claims.

What is claimed is:

1. An apparatus comprising:
a first die connected to a second die through a die-to-die (D2D) interface, wherein:
the first die includes a first interconnect configured to provide first lanes communicating with the second die to the D2D interface,
the first interconnect includes a first logic circuit configured to indicate a correlation between a number of chiplet dies connected to the first lanes and connected signal pins from among a plurality of signal pins of the connected chiplet dies,
the second die includes the number of connected chiplet dies each including a second interconnect configured to provide second lanes to the D2D interface from each of the connected chiplet dies,
the second interconnect includes a second logic circuit configured to indicate the correlation, and
the second lanes are configured to be set according to a number of the connected signal pins of the connected chiplet dies.

2. The apparatus of claim 1, wherein each of the first and second logic circuits includes:
a mapping table configured to set a correlation between the number of connected chiplet dies and information and a number of the connected signal pins of each of the connected chiplet dies.

3. The apparatus of claim 2, wherein the second die includes chiplet dynamic random access memories (DRAMs), and
wherein the connected signal pins of the chiplet DRAMs include command/address (CA) pins and data (DQ) pins.

4. The apparatus of claim 3, wherein the mapping table includes registers configured to:
set a number of the CA pins and a number of the DQ pins to be relatively small,
set a number of the chiplet DRAMs to be relatively large, and
provide the number of chiplet DRAMs as a high-capacity memory to the D2D interface by setting the number of chiplet DRAMs to be relatively large.

5. The apparatus of claim 4, wherein operands of a command transmitted to the CA pins are transmitted to the chiplet DRAMs in synchronization with a relatively large number of clock signal edges.

6. The apparatus of claim 3, wherein the mapping table includes registers configured to:
set a number of the CA pins and a number of the DQ pins to be relatively large,
set a number of the chiplet DRAMs to be relatively small, and
provide a high-speed memory to the D2D interface by using the relatively large number of CA pins.

7. The apparatus of claim 6, wherein operands of a command transmitted to the CA pins are transmitted to the chiplet DRAMs in synchronization with a relatively small number of clock signal edges.

8. The apparatus of claim 2, wherein the second die includes chiplet non-volatile memories (NVMs), and
wherein the connected signal pins of the chiplet NVMs include input/output signal (IO) pins.

9. The apparatus of claim 1, wherein the first lanes include at least one redundant lane.

10. The apparatus of claim 9, wherein the at least one redundant lane is configured to handle a defective lane from among the first lanes.

11. The apparatus of claim 1, wherein lanes from among the first lanes not connected to the second lanes in the D2D interface are configured to be used for:
parameter exchange between the first die and the connected chiplet dies,
access for debug/compliance, or
training and management of a link.

12. The apparatus of claim 1, wherein the D2D interface is configured to support a compute express link (CXL) protocol or a universal chiplet interconnect express (UCIe) protocol.

13. A method of communicating using a die-to-die (D2D) interface, the method comprising:
providing first lanes of a first die connected to a second die to the D2D interface through a first interconnect of the first die;
providing second lanes of the second die to the D2D interface through a second interconnect of the second die;
setting a correlation between a number of chiplet dies of the second die connected to the first lanes and connected signal pins from among a plurality of signal pins of the connected chiplet dies in a logic circuit of each of the first and second interconnects;
setting the second lanes according to a number of the connected signal pins of the connected chiplet dies; and
communicating between the first die and the connected chiplet dies in an interconnected state, via the D2D interface.

14. The method of claim 13, wherein the setting of the correlation includes:
in each of the first interconnect and the second interconnect, storing the correlation between the number of the connected chiplet dies and information and the number of the connected signal pins in a mapping table of the logic circuit.

15. The method of claim 13, wherein the providing of the first lanes includes:
providing at least one redundant lane from among the first lanes to the D2D interface, and
handling a defective lane from among the first lanes by using the at least one redundant lane.

16. The method of claim 13, wherein the providing of the second lanes includes:
performing a switching operation of connecting the connected signal pins from among the plurality of signal pins of the connected chiplet dies to the second lanes.

17. The method of claim 13, wherein the communicating between the first die and the connected chiplet dies includes:
performing a memory training operation by the first die on a chiplet dynamic random access memory (DRAM) from among the connected chiplet dies.

18. The method of claim 13, wherein the providing of the first lanes includes:
providing at least one redundant lane not connected to the second lanes from among the first lanes in the D2D interface, and
by using the at least one redundant lane, performing parameter exchange between the first die and the connected chiplet dies, access for debug/compliance, or training and management of a link.

19. An apparatus comprising:
a first die including a host processor; and
a second die connected to the first die through a die-to-die (D2D) interface, and including a die architecture separated from the first die, wherein:
the first die includes a first interconnect configured to provide first lanes to the D2D interface,
the first interconnect includes a first logic circuit configured to indicate a correlation between a number of chiplet dynamic random access memories (DRAMs) connected to the first lanes and command/address (CA) pins and data (DQ) pins from among a plurality of signal pins of the connected chiplet DRAMs,
each of the number of chiplet DRAMs includes a second interconnect configured to provide second lanes to the D2D interface,
the second interconnect includes a second logic circuit configured to indicate the correlation, and
the first die and the number of chiplet DRAMs are configured to communicate with each other in an interconnected state through the D2D interface.

20. The apparatus of claim 19, wherein each of the first and second logic circuits includes a mapping table configured to store a correlation between the number of the chiplet DRAMs and a number of the CA pins and a number of the DQ pins of each of the connected chiplet DRAMs.

* * * * *